United States Patent [19]

Roberts et al.

[11] Patent Number: 5,587,663
[45] Date of Patent: Dec. 24, 1996

[54] METHOD FOR MEASURING THE INDUCTANCE OF EACH RESONATOR OF A COUPLED-DUAL RESONATOR CRYSTAL

[75] Inventors: Gerald E. Roberts; Michael E. Roberts, both of Lynchburg, Va.

[73] Assignee: XTAL Technologies, Ltd., Carle Place, N.Y.

[21] Appl. No.: 407,078

[22] Filed: Mar. 20, 1995

Related U.S. Application Data

[63] Continuation-in-part of Ser. No. 370,495, Jan. 9, 1995.
[51] Int. Cl.⁶ ................................................. G01R 29/22
[52] U.S. Cl. ............................................ 324/727; 324/655
[58] Field of Search .................................... 324/649, 652, 324/653, 654, 655, 681, 682, 683, 707, 708, 709, 719, 727, 76.19, 76.21, 76.22, 76.25, 76.39, 76.49, 76.52, 76.77

[56] References Cited

U.S. PATENT DOCUMENTS

| | | | |
|---|---|---|---|
| 3,963,982 | 6/1976 | Roberts | 324/727 |
| 3,992,760 | 11/1976 | Roberts | 29/25.35 |
| 4,093,914 | 6/1978 | Peppiatt et al. | 324/727 |
| 4,433,316 | 2/1984 | Roberts et al. | 333/189 |
| 4,477,952 | 10/1984 | Crescenzi et al. | 29/25.35 |
| 4,484,158 | 11/1984 | Roberts et al. | 333/191 |
| 4,578,634 | 3/1986 | Healey et al. | 324/727 |
| 4,627,379 | 12/1986 | Roberts et al. | 118/721 |
| 4,676,993 | 6/1987 | Roberts et al. | 427/10 |
| 4,833,430 | 5/1989 | Roberts et al. | 333/191 |
| 4,839,618 | 6/1989 | Roberts et al. | 333/191 |
| 5,047,726 | 9/1991 | Roberts et al. | 324/727 |
| 5,049,828 | 9/1991 | Toliver et al. | 324/727 |
| 5,146,174 | 9/1992 | Toliver et al. | 324/727 |
| 5,272,597 | 12/1993 | Staples et al. | 361/816 |

OTHER PUBLICATIONS

Roberts, David A. et al., "On the Four-Frequency Measurement Process for Coupled Dual Resonator Crystals", IEEE Transactions on Instrumentation and Measurement, vol. 42, No. 5, Oct. 1993, pp. 924–926.

Primary Examiner—Kenneth A. Wieder
Assistant Examiner—Glenn W. Brown
Attorney, Agent, or Firm—Dorsey & Whitney LLP

[57] ABSTRACT

The present invention discloses a method for obtaining frequency parameters to determine the resonator inductances of a crystal. Under this method, a plurality of frequencies are applied to a first electrode. This application is performed once while the second electrode and the common electrode are connected by a short circuit, and then again when the second electrode and the common electrode are capacitively connected or open circuited. During each application of the plurality of frequencies to the crystal, the phase response for the output of the resonator circuit is monitored. Then the time response of the crystal is determined. Next, the time delay relative maxima for the time response is determined. Finally, the frequencies at which the time delay relative maxima occur are determined. These frequencies correspond to the inflection points where the change in phase goes from monotonically increasing to monotonically decreasing. This process is repeated with the crystal turned around in the test fixture to obtain a second set of frequencies. These frequencies are then used to calculate the resonator inductances of the crystal. Alternatively, all of the critical frequencies can be determined with the second electrode and the common electrode connected by a short circuit. In this case, however, the critical frequencies correspond to the time delay maxima and minima for the time response. This method is applicable regardless of the frequencies of the resonators or the amount of frequency separation between the resonators.

23 Claims, 13 Drawing Sheets

METHOD FOR MEASURING THE INDUCTANCE OF EACH RESONATOR OF A COUPLED-DUAL RESONATOR CRYSTAL

RELATED APPLICATION

The subject application is a continuation-in-part to the following copending commonly assigned U.S. patent application Ser. No. 08/370,495, entitled METHOD FOR MEASURING SELECTED FREQUENCIES OF A COUPLED-DUAL RESONATOR CRYSTAL, filed Jan. 9, 1995, pending.

TECHNICAL FIELD

The present invention is generally related to a process for determining parameters of a monolithic coupled-dual resonator crystal. Specifically, it is directed to a process to determine the inductance of each resonator of a coupled-dual resonator crystal. The resonator inductances can be determined for these crystals at any step in a crystal manufacturing process and for such crystals over a broad range of fundamental and overtone frequencies including coupled-dual resonator crystals at higher frequencies and/or having relatively high resonator resistances.

BACKGROUND OF THE INVENTION

Such crystals are used extensively in the radio communication industry. Exemplary uses include IF filter and discriminator applications in mobile and cellular radios. Coupled-dual resonator crystals are preferred in many applications because they provide the characteristics of a very narrow filter due to the extremely high Q of the associated crystal resonators, as well as the narrow coupling between resonators. Such very narrow filter characteristics are virtually impossible or extremely difficult to realize with lumped devices, such as inductors and capacitors.

At the time the original Peppiatt and Roberts methodology was invented, as taught in U.S. Pat. No. 4,093,914, coupled-dual resonator crystals were designed to operate at frequencies only as high as the low 20 megahertz ("MHz") range. Currently, units at 45 MHz and 57.5 MHz are routinely built in production. Because of the requirements for higher and higher IF frequencies for cellular and mobile radios, with units in the 70 MHz to 90 MHz frequency range being used or considered in new product applications, the requirement for superior measurement accuracy for such high frequency coupled-dual resonator crystals is vitally important for testing and fabricating coupled-dual crystals and for producing high frequency monolithic crystal filters which meet the new radio specifications.

Key characteristics of these coupled dual crystals must be measured during the fabrication process as well as at the final test operation. A need exists for a reliable, accurate, and repeatable process for determining these characteristics of a coupled-dual resonator crystal. In particular, four critical frequencies, F1, F2, F3, and F4 must be determined in order to calculate first and second resonator frequencies, the normalized center frequency, the synchronous peak separation frequency and resonator inductances.

U.S. Pat. No. 4,093,914 discloses a process for measuring the four critical frequencies in coupled-dual resonator crystals and the formulas for determining the resonator frequencies, the normalized center frequency, and the synchronous peak separation frequency. The Peppiatt and Roberts methods involve determining four critical frequencies by monitoring, in the first case (Case I), one of the two crystal ports while shorting the second port. In the second case (Case II), they are determined by monitoring one of the two crystal ports while shorting the second port to obtain two frequencies and effectively open circuiting the second port or connecting a capacitor across it to obtain the other two frequencies. In the third case (Case III, taught in U.S. Pat. No. 5,047,726, the four critical frequencies are obtained by first monitoring the first port with the second port effectively open circuited, or with a capacitor connected across the second port, to obtain two of the frequencies, and then by monitoring the second port with the first port short circuited to obtain the other two critical frequencies. In each of the three cases, each of the four critical frequencies corresponds to the zero phase crossing of the voltage phase response at or near the particular voltage amplitude maximum or minimum for the particular Case in question.

It was discovered in U.S. Pat. No. 5,049,828 that as the desired fundamental or overtone operating frequencies of such coupled-dual resonator crystals increase and/or the effective resonator resistances increase, the measured phase excursions below the zero phase reference diminish and eventually fail to cross the zero phase reference. Also, it was additionally discovered that where one of the resonator frequencies (FA, for example) is much lower than that of the other resonator frequency (FB), the voltage amplitudes associated with two of the measured frequencies (F1 and F2) will be markedly higher than the voltage amplitude associated with the other two and the latter may not exhibit excursions below the zero phase reference.

Since such zero crossings are necessary for accurate frequency measurements, U.S. Pat. No. 5,049,828 to Toliver et al. discloses a compensation circuit to establish these zero phase reference points in the Peppiatt and Roberts transmission measurement system when applied to high frequency and/or high resonator resistance crystals. However, there are several problems with the compensation approach disclosed in the Toliver patent. It adds at least two additional circuit elements to the original fixture shown in FIG. 4 of U.S. Pat. No. 5,049,828 and it must be set or tuned to produce the required zero phase crossings. It is usually tuned to produce the four frequencies at the final crystal test operation. It, therefore, tends to have accuracy problems at frequencies other than final frequency. Separate fixtures must be used for coupled-dual resonator crystals in different frequency ranges. There also tend to be correlation problems from fixture to fixture whenever a fixture must be set by a variable coil/capacitor combination.

Therefore, the need arises as to how to determine the values of the four critical frequencies, F1, F2, F3 and F4, for the cases taught in U.S. Pat. Nos. 4,093,914, 5,047,726 and 5,049,828 for those situations where the phase responses do not provide undiminished zero phase crossings without external compensation.

Another parameter calculated from the four critical frequencies and extremely important in developing or evaluating a coupled-dual resonator monolithic crystal filter is the inductance of each resonator. Accurate determination of inductance enables the proper coupling of two or more coupled-dual crystals together to form a filter and allows for the correct termination of the filter. Prior to the present invention, resonator inductances were assumed to be the values determined from measuring each resonator's electrode dimensions after an electrode pattern had been plated onto the crystal wafer at the baseplate operation. However, the actual inductance of each resonator could not be measured with this method accurately. In the early 1970s, it was discovered that a coupled-dual crystal resonator measured around either one of two transmission peak resonances produced approximately twice the inductance of one of the two resonators or approximately the sum of the two resonator inductances, as most coupled-dual resonator crystal designs produced resonators with equal inductances. However, this scheme only provided an approximate value of the inductances of a coupled-dual resonator crystal and often contained substantial errors. The inductance measurement inaccuracies were noticed to increase significantly at higher frequencies (i.e., at 30 megahertz and above). In addition, this process required substantial hardware and software.

Therefore, what is needed is a method for accurately determining resonator inductances of a coupled-dual resonator crystal at both low and high frequencies.

SUMMARY OF THE INVENTION

The present invention provides a novel method for accurate determination of the resonator inductances of a coupled-dual resonator crystal at any step in the crystal manufacturing process. These resonator inductances represent important characteristics essential in the crystal manufacturing process. The accuracy in determining the resonator inductances is extremely important in ensuring the correct coupling of one or more crystals together and for allowing proper termination of the filter when one or more crystals are used in making a filter. An ability to accurately monitor the two resonator inductances also allows for the tight control of both ripple and group delay in fixed termination applications. A tight group delay is required in the IF filtering in all radio applications including digital cellular radio receivers.

Under this method, a plurality of frequencies are applied to the first (or input) electrode of the crystal. In the preferred method, this approach is performed once while the second (or output) electrode and the common electrode are connected by a short circuit, and then again when the second electrode and the common electrode are open-circuited or connected with a capacitor.

During each application of the plurality of frequencies to the coupled-dual resonator crystals, the phase response of the driving point impedance is monitored via a voltage divider network. Next, the time delay relative maxima which occur when the change in phase changes from monotonically decreasing to monotonically increasing are determined. Finally, the frequencies at which the time delay relative maxima occur are the critical frequencies (F1, F2, F3 and F4). These critical frequencies are all that is required to calculate the resonator A frequency (FA), resonator B frequency (FB), the synchronous peak separation frequency (SPSF), and the normal center frequency (NCF) of the crystal.

The critical frequencies (F1, F2, F3 and F4) are also used to calculate resonator inductances. However, a second set of critical frequencies (F1', F2', F3' and F4') must also be determined to calculate resonator inductances. The critical frequencies (F1', F2', F3' and F4') are determined in the same manner as the critical frequencies (F1, F2, F3 and F4) for cases I, II and III, except with the crystal turned around in the test device. Furthermore, the static, or pin-to-pin, capacitances of the crystal ($C_{O1}$ and $C_{O2}$) must be measured and/or determined. In addition, any external capacitance and/or fixture reactance, normally a capacitance, occurring across the test fixture terminal pair, 17 and 18, in FIG. 4B into which the resonator to be driven is inserted must be determined and/or any external capacitance and/or fixture reactance, normally a capacitance, occurring across the fixture terminal pair, 19 and 18, into which the other side of the crystal is inserted must be determined to use appropriately with $C_{O1}$ and $C_{O2}$ in calculating the first and second resonator inductances ($L_1$ and $L_2$).

This preferred process constitutes use of the time delay maxima for determining the first set of four critical frequencies in case II of the four frequency measurement process taught in U.S. Pat. Nos. 4,093,914 and 5,047,726, as well as the critical frequencies (F1', F2', F3' and F4') with the crystal turned around in the test fixture. It encompasses cases I and III taught in those patents as well.

Using this method, the calculation of resonator inductances can be made very repeatably and very accurately at any step in the fabrication process. The invention provides for improved crystal fabrication techniques, precision evaluation and testing of high frequency units, and the use of the present invention ultimately results in lower cost units with improved quality. This process is believed to be applicable regardless of the frequencies of the resonators, the size of the intrinsic coupling between the resonators or the values of resonator resistances.

Alternatively, for those crystals not at higher fundamental and overtone frequencies and/or not having relatively high resonator resistances, the critical frequencies (F1, F2, F3 and F4) can be determined from the maximum and/or minimum voltages (or from zero phase crossings in the mathematical neighborhood of the maximum and/or minimum voltages) in Cases I, II or III as taught in U.S. Pat. Nos. 4,093,914 and 5,047,726. These critical frequencies (F1, F2, F3 and F4) are used to calculate one of the resonator inductances. Again, the critical frequencies (F1', F2', F3' and F4') necessary for calculating the other resonator inductance can be determined in the same manner with the crystal turned around in the test fixture.

It is an object of the present invention to provide a method of determining certain critical frequencies (i.e., F1, F2, F3, F4, F1', F2', F3' and F4') for coupled-dual resonator crystals operating at any frequency.

It is an object of the present invention to provide a method of determining the critical frequencies and calculating the resonator inductances at any stage of the fabrication process without the need for re-tuning or re-calibration.

It is an object of the present invention to provide a method of accurately and repeatably determining the critical frequencies and calculating resonator inductances that provides results independent of resonator resistances.

DETAILED DESCRIPTION OF THE PREFERRED EMBODIMENT

Figure 1:
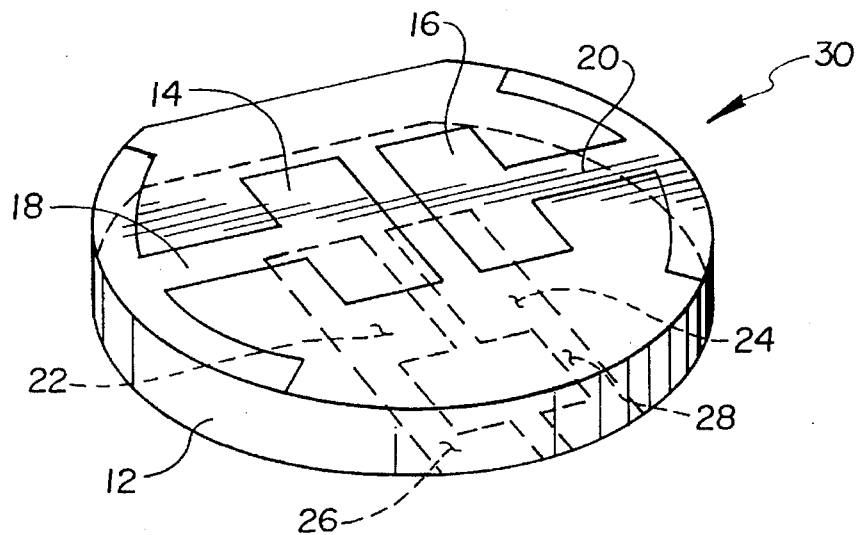
FIG. 1 is a perspective view of a coupled-dual resonator crystal.
Figure 2A:
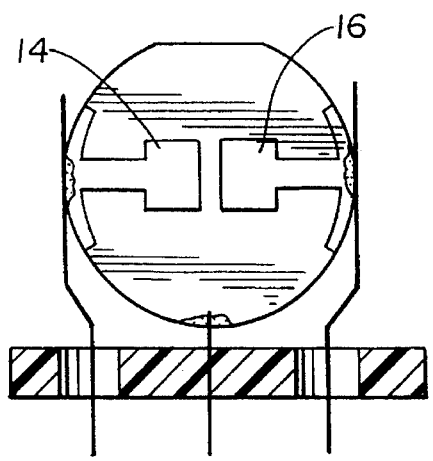
FIGS. 2A and 2B show the active and ground sides of mounted crystal.
Figure 2B:
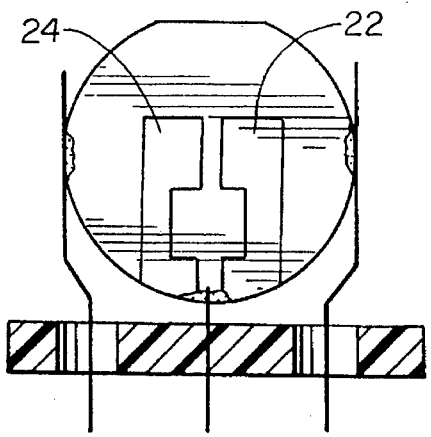
Figure 3:
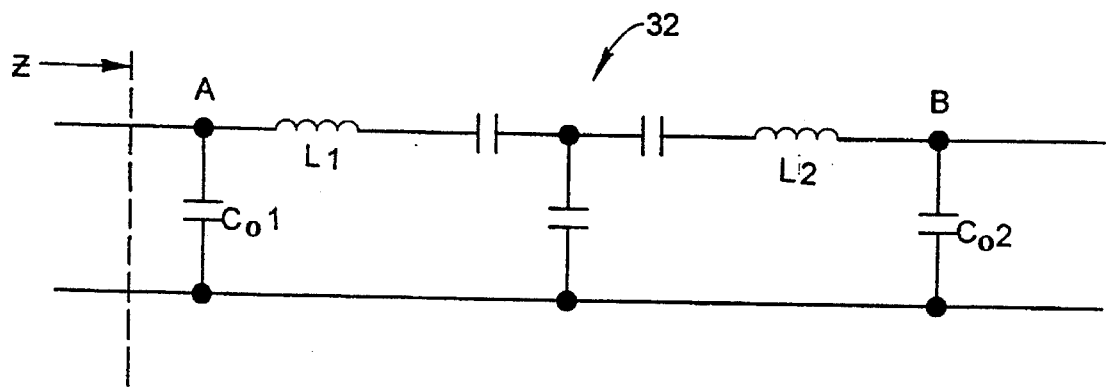
FIG. 3 illustrates an equivalent circuit of a coupled-dual resonator crystal.

Typically a coupled-dual resonator crystal in its simplest form is constructed in a manner generally shown in FIGS. 1, 2A and 2B. Such crystal structure includes a first and second resonator each formed by a pair of thin film electrodes (14 and 22, 16 and 24, respectively) deposited on opposite sides of a piezoelectric wafer 12 with electrical connections to the electrodes being made by way of leads 18, 20, 26 and 28. Normally leads 26 and 28 are connected to each other, often by conductive cement as shown in FIGS. 2A and 2B. Although rectangular electrodes are illustrated, circular, semi-circular, elliptical, or semi-elliptical electrodes, for example, may also be used. FIG. 3 shows an equivalent circuit 32 of the coupled-dual resonator crystal 30 shown in FIGS. 1, 2A and 2B.

Initial nominal electrode dimensions in such structures are conventionally obtained through the use of precision masking techniques or laser machining operations as explained in commonly assigned U.S. Pat. No. 4,839,618. Subsequent measuring and manufacturing steps are performed leading to the last operation prior to sealing, namely, the final frequency adjustment process. This last operation is extremely critical since the two resonator frequencies (FA and FB) and the synchronous peak separation frequency (SPSF), as defined in commonly assigned U.S. Pat. No. 4,093,914, must be precisely controlled in order to obtain a coupled-dual resonator crystal of desired characteristics. Such criticality is even further heightened where the desired characteristics include those required for use in a high quality mobile radio IF filter with operating frequencies above about 45 MHz, for example, or with one or both effective resonator resistance values sufficiently large as compared to the effective resonator reactances. That is to say, such criticality exists any time that the combination of motional resistance and reactance for a mode of vibration is such that phase values corresponding to one or both voltage amplitude maxima associated with the driving-point impedance would fail to cross zero phase when using the conventional approach of the U.S. Pat. No. 4,093,914.

Figure 4A:
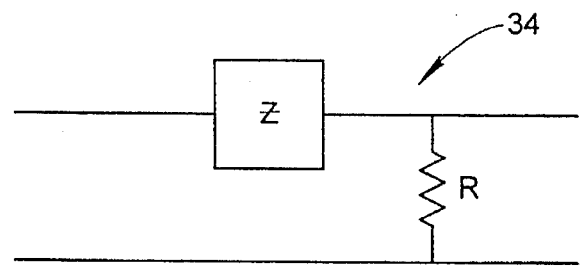
FIGS. 4A and 4B show the voltage divider network and the fixture realization for obtaining the critical frequencies, F1, F2, F3, F4, F1', F2', F3' and F4'.

As indicated in the Peppiatt and Roberts '914 patent, the coupled-dual resonator crystal 30, the equivalent circuit of which is shown in FIG. 3, is positioned such that its driving-point impedance, Z, is displayed in a voltage divider network 34 shown in FIG. 4A, from which the four frequencies are obtained for Cases I and II as taught by Peppiatt and Roberts and Case III as taught by Roberts et al. in U.S. Pat. No. 5,047,726. The actual test fixture 36 realization of FIG. 4A is shown in FIG. 4B where switch S1 is used to short-circuit the B resonator 16 of the crystal 30 or open circuit it (or put a capacitor C3 across the resonator terminal and the crystal common terminal).

The determination of the resonator inductances is also extremely important and necessary in the manufacturing of crystal structures in a precise manner. The present invention consists of a novel measurement process to determine the resonator inductances.

Figure 4B:
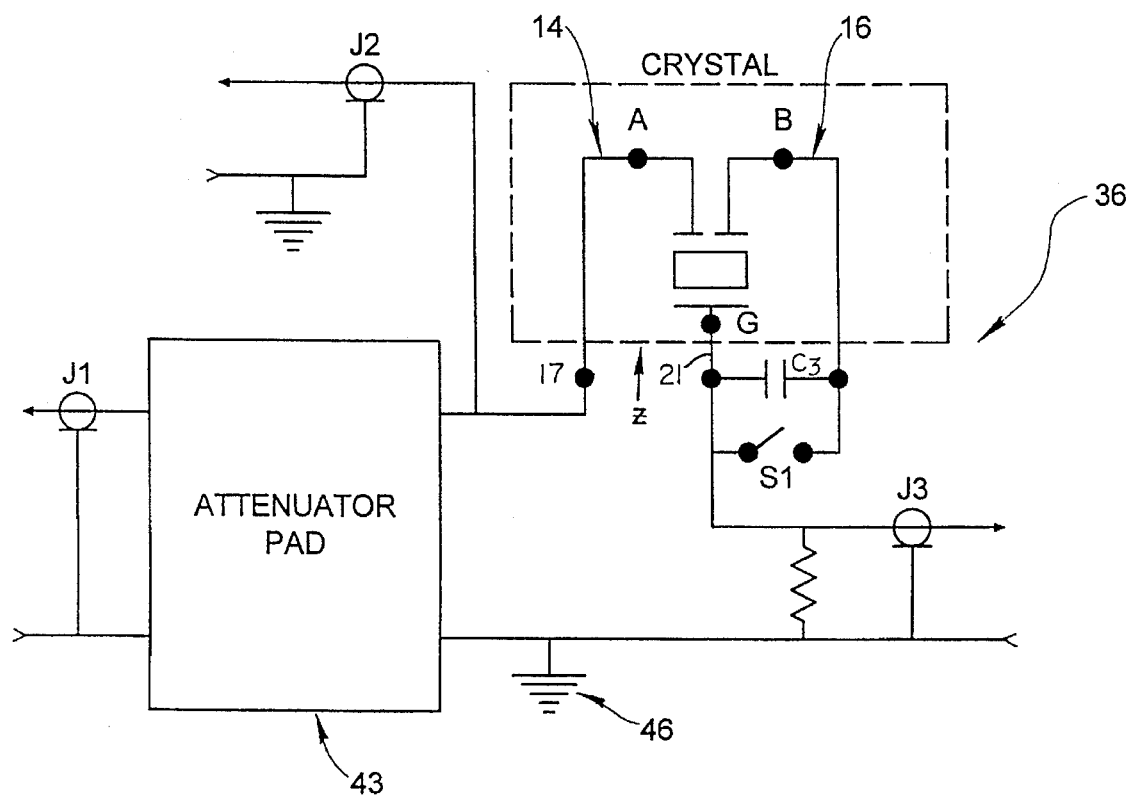

In Case II, the frequencies F1 through F4 are measured using a circuit as illustrated in FIG. 4B with a frequency synthesizer connected at J1 and the A and B probes of a vector voltmeter connected to J2 and J3, respectively. Frequencies F2 and F4 are obtained when the A side of the coupled-dual resonator is driven by a frequency synthesizer with the B side effectively open circuited (or a capacitor C3 is connected across the B side). Frequencies F1 and F3 are obtained in a similar manner but with the B side short circuited. Thereafter, key crystal parameters such as resonator frequencies (FA and FB), normalized center frequency (NCF) as well as the synchronous peak separation frequency (SPSF) may be calculated using the F1 through F4 frequencies and the equations taught in the Peppiatt and Roberts patent.

Critical frequencies F1 through F4 are also used to determine the inductance of one of the resonators. This calculation provided in equation (1) below also requires measuring the equivalent static, or pin-to-pin, capacitance of that resonator and any external capacitance and/or fixture reactance, usually a capacitance which would be in parallel with the static capacitance of that particular resonator when the crystal is inserted into the fixture. As explained below, calculating the inductance of the other resonator requires determining the critical frequencies F1', F2', F3' and F4'. These frequencies can be determined by turning the crystal around in the test fixture 36 and performing the same process as described above. Then, upon measuring the capacitance across the other resonator, the inductance can be easily calculated.

The appropriate voltage amplitude and phase information is available at the vector voltmeter B-probe. By monitoring probe J3, the time response, T, can be generated from the phase information using $T=-[d\phi/d\omega]=-[1/(2\pi)][d\phi/df]$, where $\phi$ is voltage phase, $\omega$ is radian frequency, and f is frequency.

The appropriate relative maxima and relative minima of the resulting time response can then be used to determine the appropriate eight frequencies for any of the three cases. However, it is preferred to use a Network Analyzer/S-parameter test set in place of both the frequency synthesizer and vector voltmeter because the Network Analyzer/S-parameter test set 38 allows for obtaining the time response directly.

Figure 5:
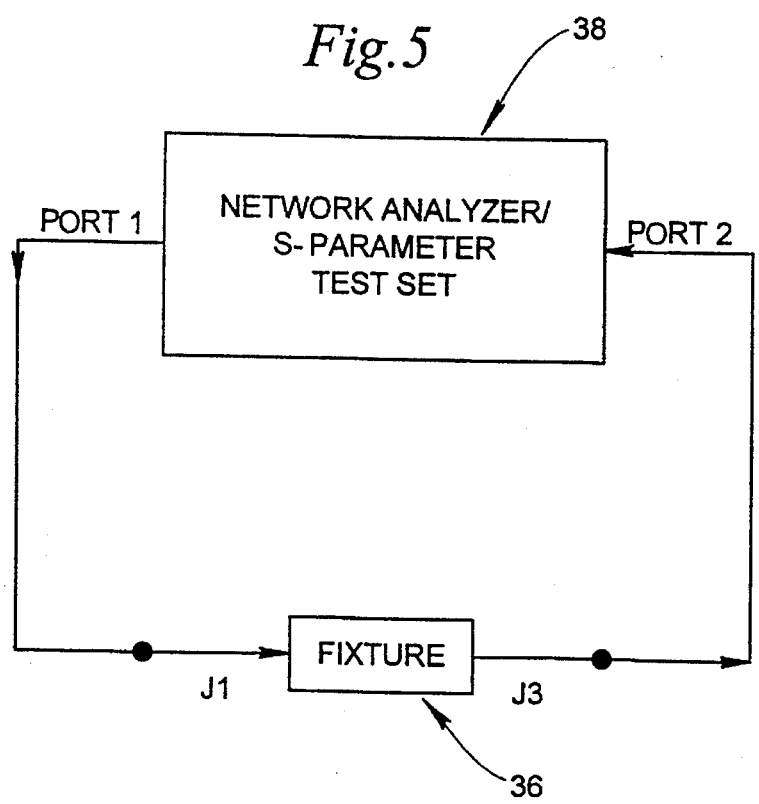
FIG. 5 shows the connection of a Network Analyzer/S-parameter test set to the test fixture.

FIG. 5 shows the configuration with the analyzer 38 port 1 connected to J1 of the test fixture 36 and port 2 connected to J3 of the fixture 36. Network Analyzer/test sets such as the HP8751A or HP3577A are of the type appropriate for determining a time response directly. The preferred embodiment is the usage of time delay relative maxima (and relative minima for case I) in case II, but it is equally valid for cases I and III.

The Network Analyzer/S-parameter test set 38 is used as connected in FIG. 5 with the crystal 30, normally mounted in a holder as in FIGS. 2A and 2B, inserted into the fixture 36 as in FIG. 4B. The S-parameter, $S_{21}$ is monitored and is a measure of output voltage amplitude and phase relative to a reference input voltage and phase. The reference output voltage, phase and time delay lines are set using a short in the socket (dotted box in FIG. 4B) from point A to common point G. Also, the various ranges and scales are set on the analyzer 38. All of this basically initializes the analyzer 38. The crystal 30 is inserted in the fixture 36 after the short is removed.

Now, a preferred embodiment corresponding to Case II can be used for determining the two resonator inductances, $L_1$ and $L_2$. The internal synthesizer of the analyzer 38 is swept over the frequency range of interest with S1 closed. Frequencies F1 and F3 are read at the time delay relative maxima. It is noted in FIG. 6E that the frequencies F1 and F3 are read at the time delay maxima associated with marks 1 and 3. Then S1 is opened either open circuiting the B-port (or B-side) of the crystal or connecting a capacitor C3 across the B-side. The internal synthesizer of the analyzer 38 is again swept over the frequency range of interest, and frequencies F2 and F4 are read at the time delay relative maxima. It is noted in FIG. 6J, the frequencies F2 and F4 occur at the frequencies associated with marks 1 and 3. The crystal parameters $C_{o1}$ and $C_{o2}$, as well as the $C_3$ (if the capacitor C3 is connected across the B side) in the fixture are also measured. The resulting four frequencies, F1–F4, and the capacitance $C_{o2}$ can be used to determine the specific inductance $L_2$ as follows:

$$L_2 = 1/[4\pi^2 C_{o2}'(F2^2+F4^2-F1^2-F3^2)] \qquad (1)$$

In equation (1), $C_{o2}'$ equals $C_{o2}$ or if the capacitance $C_3$ is inserted in parallel with $C_{o2}$, then $C_{o2}' = C_3 + C_{o2}$. The capacitance $C_{o2}'$ also includes any appropriate fixture reactance, usually a capacitance. When the fixture contains the parallel capacitance $C_3$, $C_3$ is measured in the fixture so that its value will contain the appropriate fixture capacitance. Since the time delay relative maxima associated with F1 and F3 are in the mathematical neighborhood of the corresponding amplitude relative maxima, it is convenient to find the amplitude relative maxima first and then determine the time delay relative maxima from the time delay response to obtain F1 and F3, and likewise for F2 and F4.

The crystal is then turned around in the fixture 36 and the critical frequencies (F1', F2', F3' and F4') are determined in the same manner as the critical frequencies (F1, F2, F3 and F4) described above. After these four frequencies are determined, the inductance of the first resonator can now be determined as follows:

$$L_1 = 1/[4\pi^2 C_{o1}'((F2')^2+(F4')^2-(F1')^2-(F3')^2)] \qquad (2)$$

In equation (2), $C_{o1}'$ equals $C_{o1}$ or if the capacitance $C_3$ is inserted in parallel with $C_{o1}$, then $C_{o1}' = C_3 + C_{o1}$. Here again any fixture reactance, usually a capacitance, obtained in using equation (1) can be used appropriately in determining the value of $C_{o1}'$. As indicated in U.S. Pat. Nos. 4,093,914 and 5,047,726, both of which are herein incorporated in full by reference, it is clear that this process lends itself to automatic programming with a number of different algorithms depending on what type of Network Analyzer/S-parameter test set or frequency synthesizer/vector voltmeter or similar equipment is used. In essence, the detailed process outlined above is one type of general algorithm for determining the critical frequencies for case II.

In case II, the F1, F2, F3, F4, F1', F2', F3' and F4' frequencies occur at inflection points where the change in phase goes from monotonically decreasing to monotonically increasing (phase changes from concave down to concave up). In addition, $[d\phi/d\omega]$ goes from decreasing to increasing, therefore, time delay becomes $T = -[d\phi/d\omega] = -[1/(2\pi)][d\phi/df]$ which shows that time delay T goes from increasing to decreasing which is a relative maxima at those points.

In Case I, F1 and F3 are determined in the same manner as described above in reference to Case II. However, F2 and F4 are determined by detecting the time delay relative minima when the switch S1 is closed. The crystal parameters $C_{o1}$ and $C_{o2}$ are then measured, as well as any fixture reactance, usually a capacitance, occurring across fixture terminals 17 and 21, as well as any external capacitance which may be inserted across those terminals. The value of external capacitance and/or fixture is included appropriately in the value of $C_{o1}$ in equation (3) and in the value of $C_{o2}$ in equation (4).

Figure 6A:
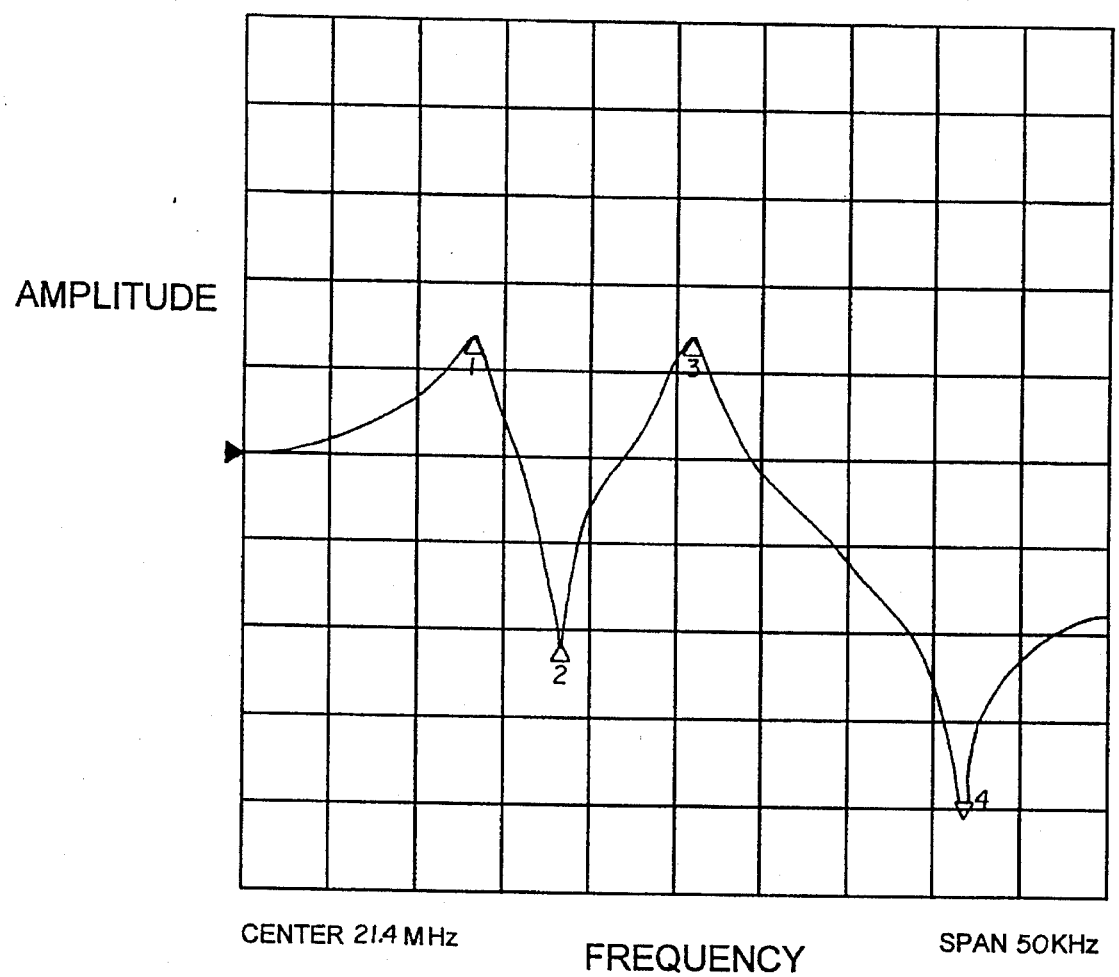
FIGS. 6A through 6J show voltage amplitude, phase and time responses for determining the critical frequencies of the present invention for a 21.4 MHz crystal.
Figure 6B:
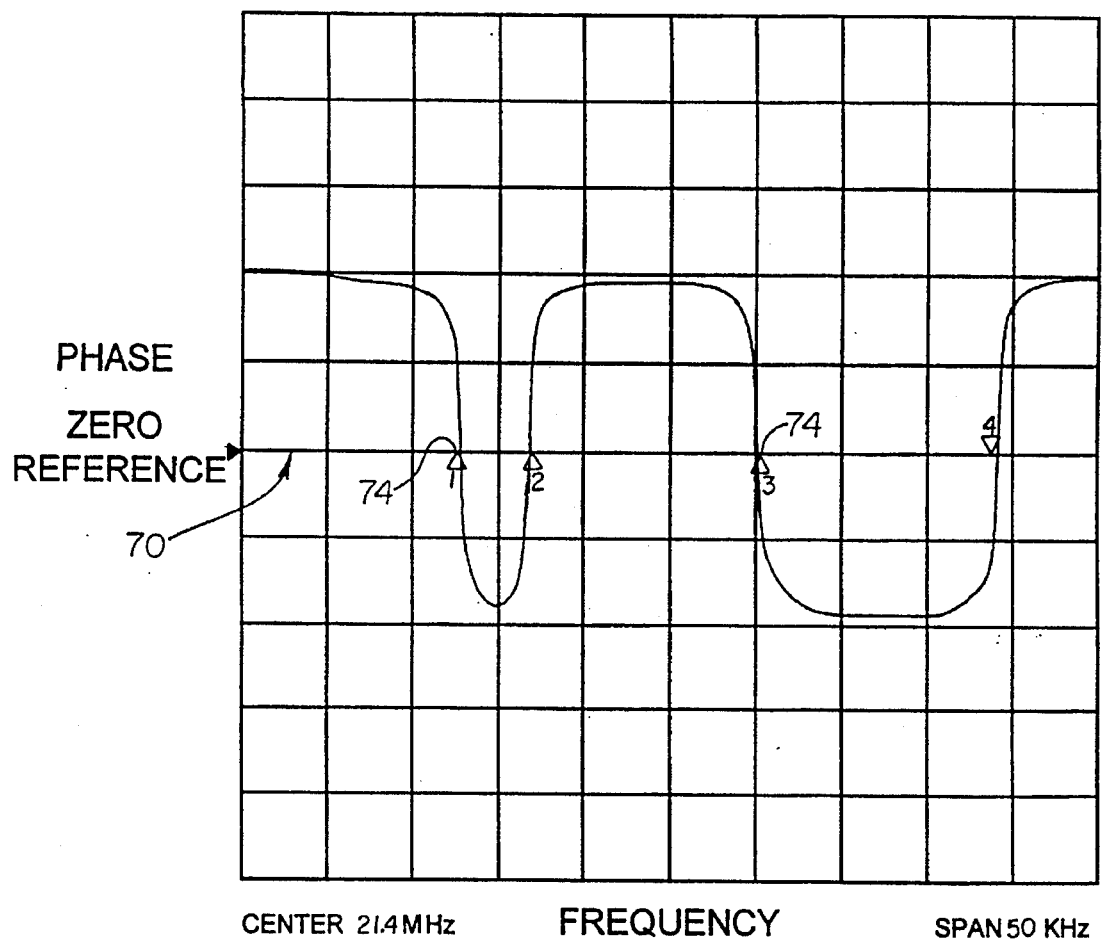
Figure 6C:
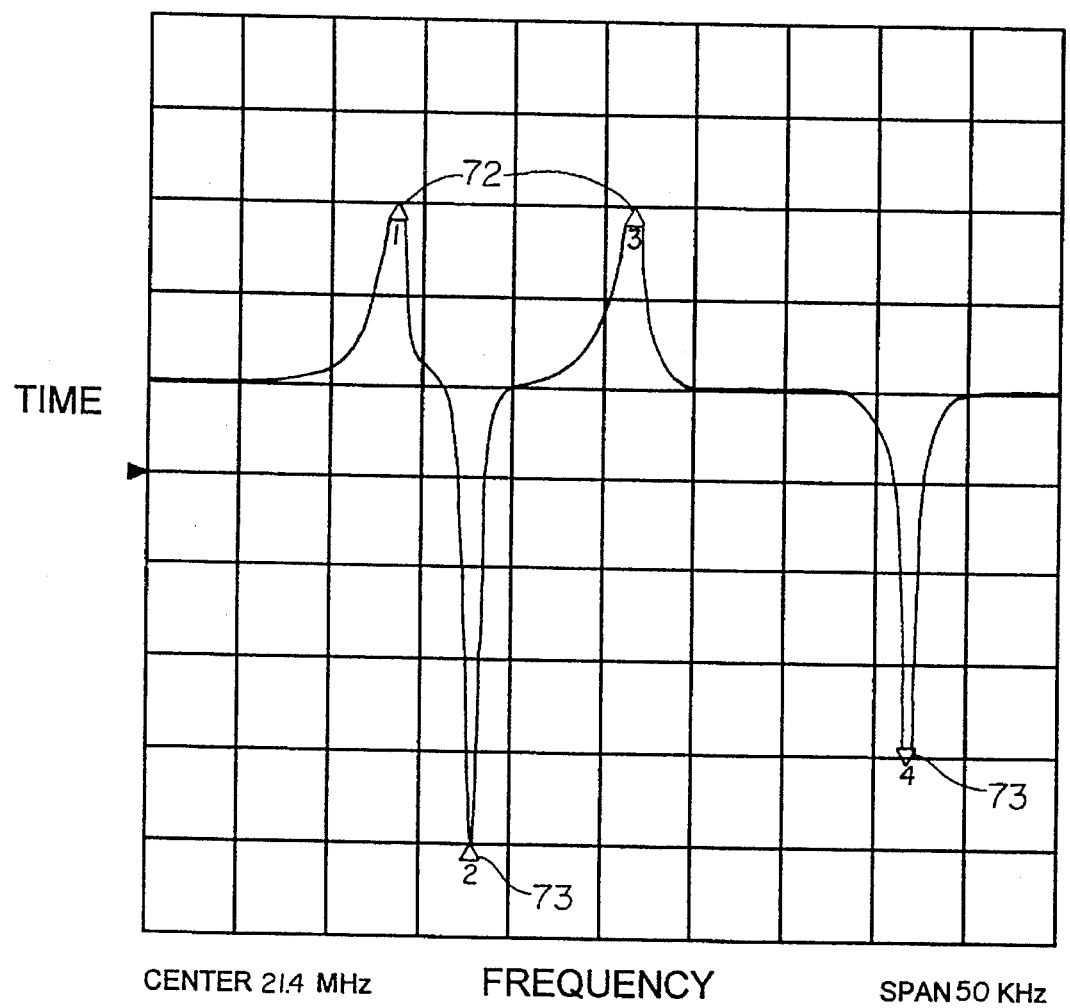
Figure 6D:
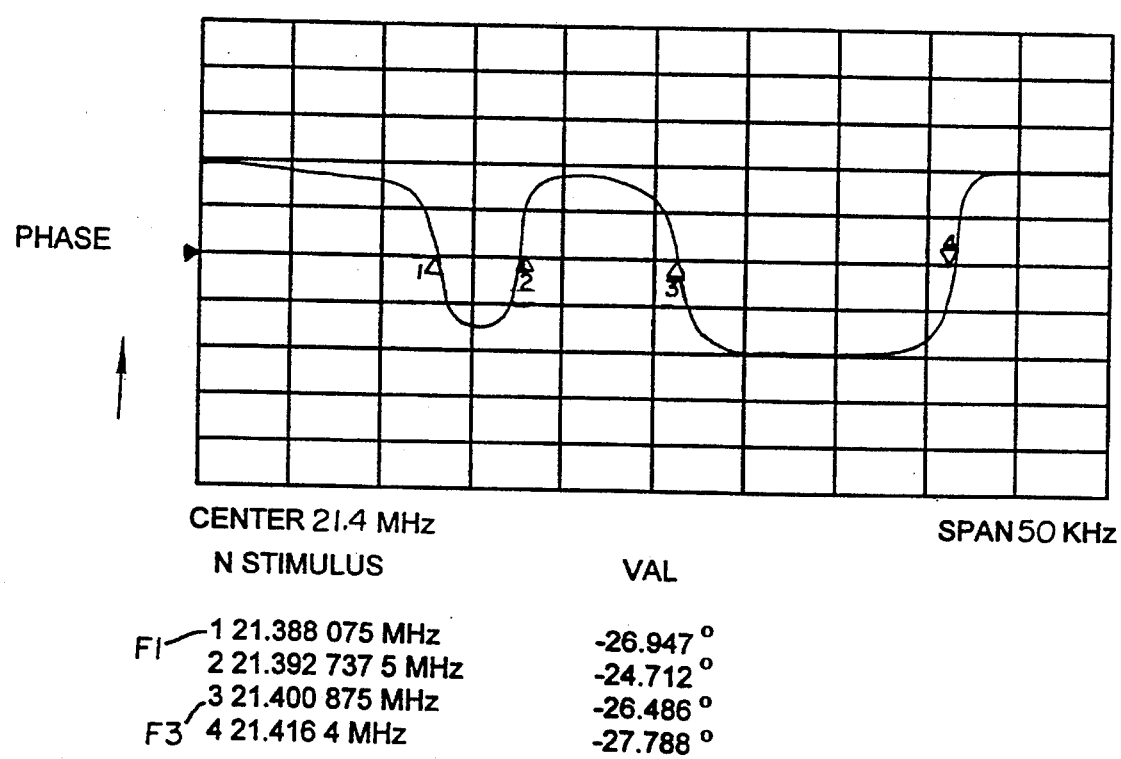
Figure 6E:
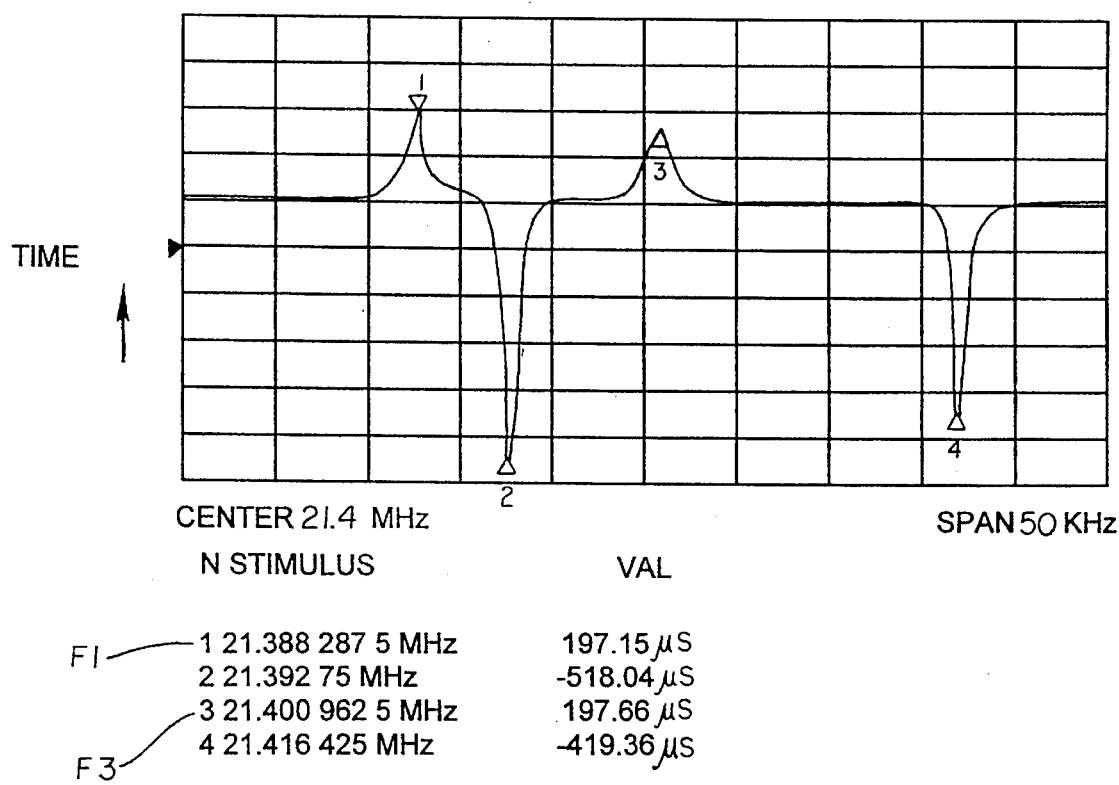

The frequencies F2 and F4 correspond to the time delay minima associated with marks 2 and 4 in FIG. 6E, with the B side short circuited. The resonator inductance L1 can now be determined as follows:

$$L_1 = 1/[4\pi^2 C_{o1}'(F2^2+F4^2-F1^2-F3^2)] \qquad (3)$$

Again, determining the inductance of the second resonator requires reversing the crystal position in the fixture 36. The four critical frequencies F1', F2', F3' and F4' are then determined in the same manner as the corresponding critical frequencies F1, F2, F3 and F4. The second resonator inductance $L_2$ can now be determined as follows:

$$L_2 = 1/[4\pi^2 C_{o2}'((F2')^2+(F4')^2-(F1')^2-(F3')^2)] \qquad (4)$$

Case III follows Case II with regard to the set up used for determining the frequencies F1, F2, F3 and F4, except now F2 and F4 are read at the time delay relative maxima as in the preferred embodiment. However, the B-side driving-point impedance is now being monitored in FIGS. 4A and 4B instead of the A-port (or A-side) of the crystal with the A-port either open-circuited or the capacitor C3 connected across the A-side in the fixture. This actually corresponds to determining the F2 and F4 with the crystal reversed in the fixture from what is shown in FIG. 4B. This reversed arrangement corresponds to F2' and F4' in Case II. As in Case II, F1 and F3 are read at the time delay relative maxima when the A-side driving-point impedance is monitored as shown in FIG. 4B with the B-port short-circuited (Switch S1 in FIG. 4B closed). This corresponds to F1 and F3 determined as in Case II. The arrangement for the Case III four frequencies is discussed in detail in U.S. Pat. No. 5,047,726. Again, the crystal capacitance $C_{01}$ is measured. Any fixture reactance, usually capacitance, and/or an external capacitance across terminals 21 and 19 of the fixture is measured and included as part of $C_{01}$ which is denoted as $C_{01}'$. The inductance L1 can then be determined as $$L_1 = 1/[4\pi^2 C_{01}'((F2')^2+(F4')^2-F1^2-F3^2)] \qquad (5)$$

To determine $L_2$, the crystal is turned around correspondingly from the conditions for measuring F2', F4' and F1, F3 above to determine F2, F4 and F1', F3'. Likewise, the crystal capacitance $C_{02}$ is measured. Any fixture reactance, usually a capacitance, and/or an external capacitance across terminals 21 and 19 of the fixture is included as part of $C_{02}$ which may be denoted as $C_{02}'$. The inductance $L_2$ can then be determined as $$L_2 = 1/[4\pi^2 C_{02}'(F2^2+F4^2-(F1')^2-(F3')^2)] \qquad (6)$$

Persons skilled in the art will appreciate that in any of the embodiments disclosed above, the frequencies F2 and F4 can be determined first, and the frequencies F1 and F3 determined second. In addition, it is recognized that the frequencies F1'–F4' can be determined prior to determination of F1–F4. Any order of determination is simply a matter of choice.

It will be understood by those of ordinary skill in the art that for Cases I, II and III disclosed above, instead of determining the critical frequencies at which the appropriate time delay relative maxima occur or at which the appropriate time delay relative maxima and minima occur depending on the particular case being used, the critical frequencies can be determined at or near the amplitude maxima and/or minima and where the phase response crosses the zero phase line.

The process for obtaining F1, F2, F3 and F4 for cases I and II is the same as the corresponding cases I and II described in U.S. Pat. No. 4,093,914. Again, the process for determining F1', F2', F3' and F4' are the same as for determining F1, F2, F3 and F4 except with the crystal turned around in the text fixture 36. Then, the resonator inductances can be found using the same appropriate corresponding equations (1) and (2), or (3) and (4), or (5) and (6). Using the amplitudes, all of the critical frequencies in Cases II and III are determined at or near the amplitude maxima. In Case I, however, the frequencies F2, F4, F2' and F4' are determined from the amplitude minima, or from the zero phase crossings in the mathematical neighborhood of the amplitude minima, or from the time delay minima in the neighborhood of the amplitude minima.

Referring to FIGS. 6A through 6J, the determination of the characteristics of a 21.4 MHz crystal in FIG. 4B is described. For the case when resonator B is short circuited, FIGS. 6A through 6C show the amplitude response (FIG. 6A), the phase response (FIG. 6B) having several zero phase crossings 74, and a time delay response (FIG. 6C) having maxima points 72 and minima points 73. Referring to FIG. 6D, using the zero phase method, F1=21388075 Hz and F3=21400875 Hz. Referring to FIG. 6E, using the time delay relative maxima process, F1=21388287 Hz and F3=21400962 Hz.

Figure 6F:
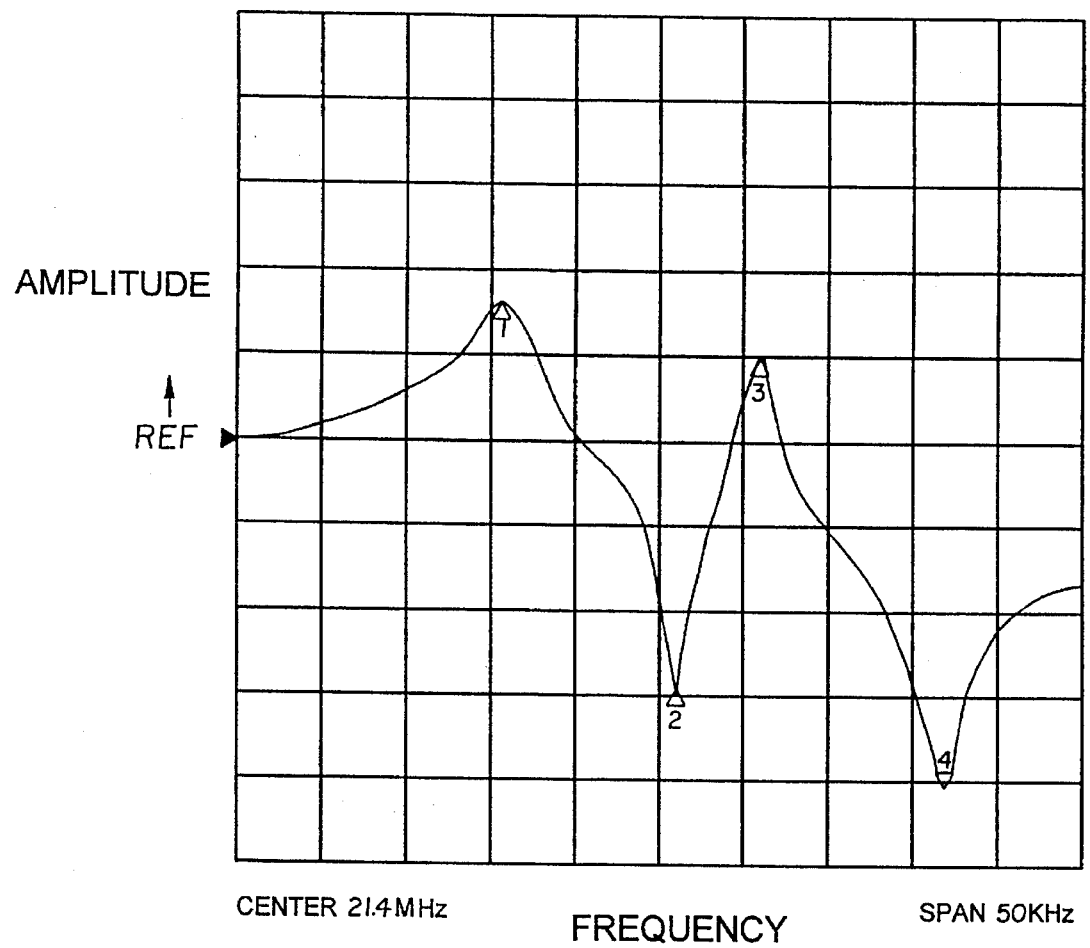
Figure 6G:
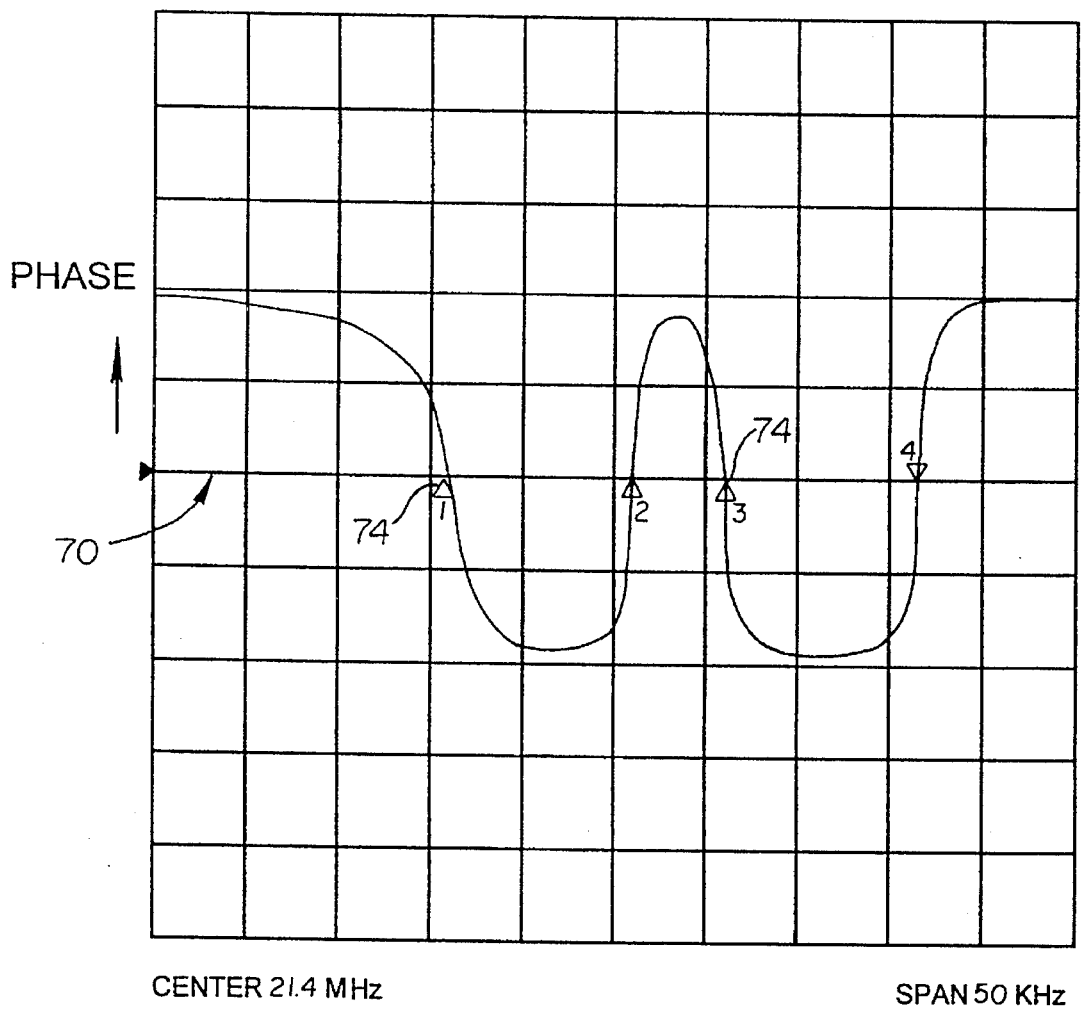
Figure 6H:
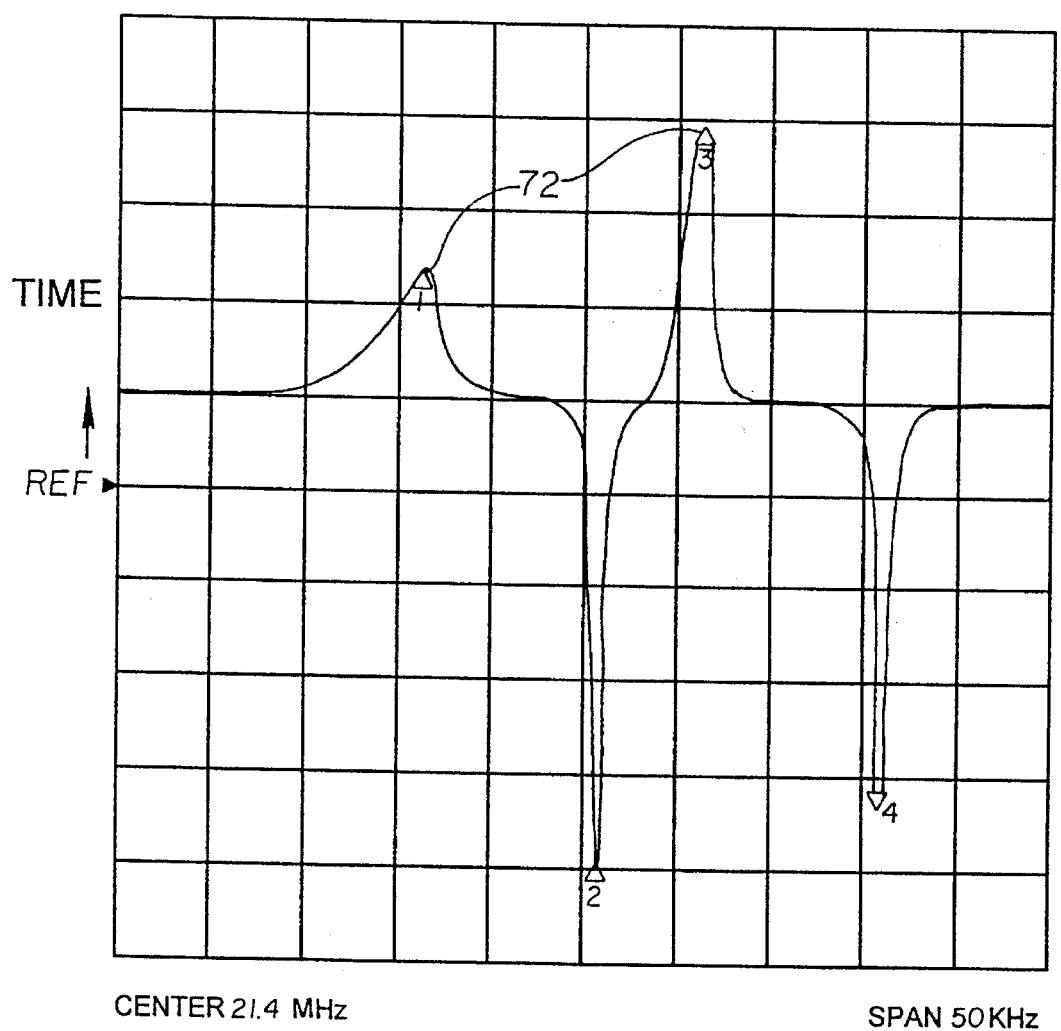
Figure 6I:
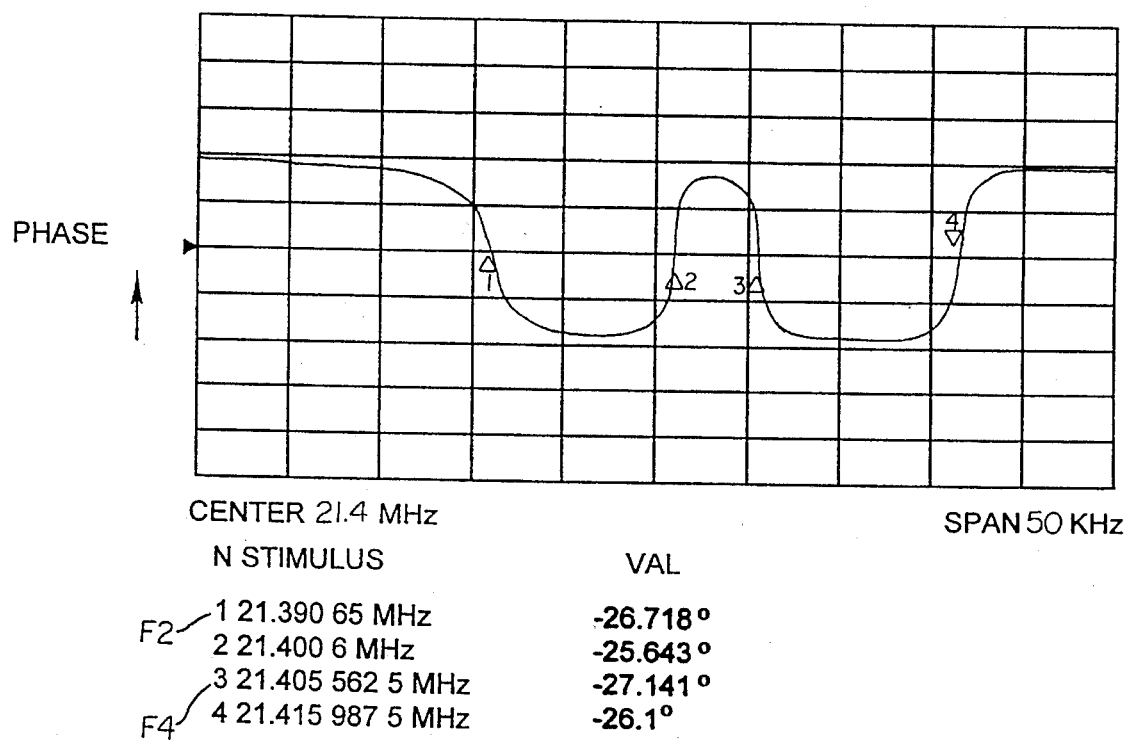
Figure 6J:
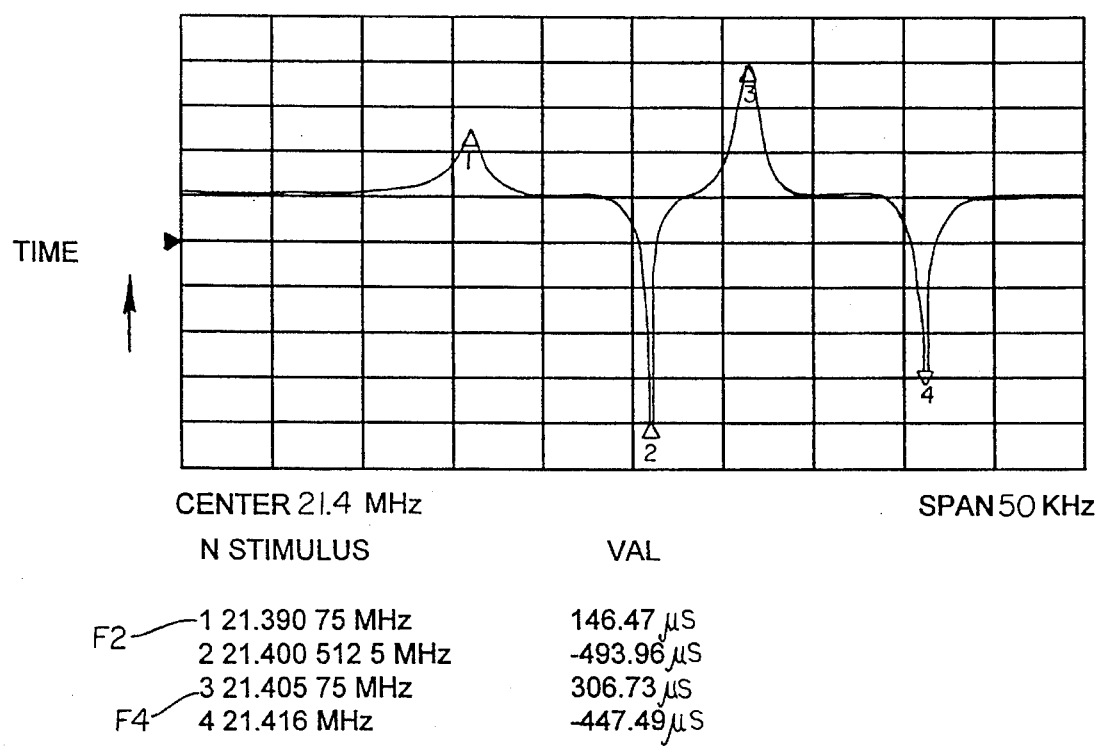

Similarly, for the case when resonator B is effectively open circuited with a 5 pf capacitance across it, FIGS. 6F through 6H show the amplitude response (FIG. 6F), the phase response (FIG. 6G) having several zero phase crossings 74, and a time delay response (FIG. 6H) having several maxima points 72. Referring to FIG. 6I, using the zero phase method, F2=21390650 Hz and F4=21405562 Hz. Referring to FIG. 6J, using the time delay maxima method, F2=21390750 Hz and F4=21405750 Hz.

Alternatively, it is noticed in FIG. 6E that F2 and F4 for Case I could also be determined by the time delay minima when resonator B is short circuited.

As mentioned above, the effects of resonator resistance becomes more pronounced as the frequency of operation of the particular coupled-dual resonator crystal goes up. The present invention allows measurement using the frequencies at the time delay relative maxima to detect the eight frequencies for calculating the two resonator inductances L1 and L2 very accurately and repeatably because the frequencies of the time delay relative maxima tend to be independent of resonator resistances.

Once the frequencies F1, F2, F3, F4, F1', F2', F3' and F4' have been determined, the key resonator inductances of the crystal may be determined according to the methods described above. In this manner, these methods for accurately measuring resonator inductance can be done at any stage of fabrication after the resonator electrodes are formed. These methods result in the ability to tightly control ripple and group delay of a crystal filter. In addition, the ability to couple together crystals and/or terminate coupled-dual resonator crystals as filters in also improved significantly.

While the preferred embodiment of the present invention has been described, it should be appreciated that various modifications may be made by those skilled in the art without departing from the spirit and scope of the present invention. Accordingly, reference should be made to the claims to determine the scope of the present invention.

What is claimed is:

1. A method of determining resonator inductances of a coupled-dual resonator crystal connected to a test fixture, the crystal having a piezoelectric plate, a first electrode on the plate, a common electrode on the plate, a second electrode on the plate, wherein the connection of the first electrode and the common electrode form a first resonator and the connection of the second electrode and the common electrode form a second resonator, the method comprising:

inserting the crystal in the test fixture in a first position;

connecting a frequency synthesizer to the first electrode and to a reference point;

applying a plurality of frequencies to the first electrode;

monitoring a phase response of the crystal with respect to frequency;

monitoring a time response of the crystal with respect to frequency;

determining time delay relative maxima from the time response;

determining a first set of critical frequencies corresponding to the time delay relative maxima;

measuring equivalent static capacitances of the first and second resonator; and calculating the inductance of the first resonator using the first set of critical frequencies, whereby the resonator inductances are accurately determined for low and high frequency filters at any step in a crystal manufacturing process.

2. The method of claim 1 further comprising the steps of:

turning the crystal around in the test fixture so as to place the crystal in a second position;

applying the plurality of frequencies to the second electrode;

monitoring a phase response of the crystal with respect to frequency with the crystal in the second position;

monitoring a time response of the crystal with respect to frequency with the crystal in the second position;

determining time delay relative maxima from the time response with the crystal in the second position;

determining a second set of critical frequencies corresponding to the time delay relative maxima with the crystal in the second position; and determining the inductance of the second resonator using the second set of frequencies.

3. The method of claim 2, wherein the common electrode is connected to the first electrode by a switch, the switch being in a closed position and the method further comprising the steps of:

determining the time delay relative minima of the time response with the crystal in the second position; and wherein the second set of critical frequencies corresponds to the time delay relative maxima and the time delay relative minima.

4. The method of claim 1, wherein the second electrode is connected to the common electrode by an external capacitor and the method further comprising measuring the external capacitance.

5. The method of claim 1, wherein the second electrode and common electrode are open circuited.

6. The method of claim 1, wherein the common electrode is connected to the second electrode by a switch, the switch being in a closed position and the method further comprising the steps of:

determining the time delay relative minima of the time response; and wherein the first set of critical frequencies corresponds to the time delay relative maxima and the time delay relative minima.

7. A method of determining resonator inductances of a coupled-dual resonator crystal connected to a test fixture, the crystal filter having a piezoelectric plate, a first electrode on the plate, a common electrode on the plate, and a second electrode on the plate, wherein the connection of the first electrode and the common electrode form a first resonator and the connection of the second electrode and the common electrode form a second resonator, the method comprising:

inserting the crystal in the test fixture in a first position;

connecting a frequency synthesizer to the first electrode and to a reference point;

connecting the common electrode and the second electrode so that the connection is a short circuit;

applying a plurality of frequencies to the first electrode;

monitoring a phase response of the crystal with respect to frequency;

monitoring a time response of the crystal with respect to frequency;

determining time delay relative maxima and minima for the time response;

determining a first set of critical frequencies corresponding to the time delay relative maxima and minima;

measuring an equivalent static capacitance of the first resonator; and calculating the inductance of the first resonator using the first set of critical frequencies and the first resonator equivalent static capacitance.

8. The method of claim 7 further comprising:

turning the crystal around in the test fixture so as to place the crystal in a second position;

connecting the common electrode and the first electrode so that the connection is a short circuit;

applying a plurality of frequencies to the second electrode with the crystal in the second position;

monitoring a phase response of the crystal with respect to frequency with the crystal in the second position;

monitoring a time response of the crystal with respect to frequency with the crystal in the second position;

determining time delay relative maxima and minima for the time response with the crystal in the second position;

determining a second set of critical frequencies corresponding to the time delay relative maxima and minima with the crystal in the second position;

measuring an equivalent static capacitance of the second resonator; and determining the inductance of the second resonator using the second set of critical frequencies, whereby the resonator inductances are accurately determined for low and high frequency filters at any step in a crystal manufacturing process.

9. A method of determining resonator inductances of a coupled-dual resonator crystal connected to a test fixture, the crystal filter having a piezoelectric plate, a first electrode on the plate, a common electrode on the plate, and a second electrode on the plate, wherein the connection of the first electrode and the common electrode form a first resonator and the connection of the second electrode and the common electrode form a second resonator, the method comprising:

inserting the crystal in the test fixture in a first position;

connecting a frequency synthesizer to the first electrode and to a reference point;

connecting the common electrode and the second electrode so that the second resonator is short circuited;

applying a plurality of frequencies to the first electrode with the second resonator short circuited;

monitoring a phase response of the crystal with respect to frequency with the second resonator short circuited;

monitoring a time response of the crystal with respect to frequency with the second resonator short circuited;

determining time delay relative maxima for the time response with the second resonator short circuited;

determining a first set of critical frequencies corresponding to the time delay relative maxima with the second resonator short circuited;

measuring equivalent static capacitances of the first and second resonators;

disconnecting the common electrode and the second electrode so that the second resonator is open circuited;

applying a plurality of frequencies to the first electrode with the second resonator open circuited;

monitoring a phase response of the crystal with respect to frequency with the second resonator open circuited;

monitoring a time response of the crystal with respect to frequency with the second resonator open circuited;

determining time delay relative maxima for the time response with the second resonator open circuited;

determining a second set of critical frequencies corresponding to the time delay relative maxima with the second resonator open circuited; and calculating the inductance of the second resonator using the first and second sets of critical frequencies and the second resonator equivalent static capacitance.

10. The method of claim 9 further comprising the steps of:

reversing the position of the crystal in the test fixture so as to place the crystal in a second position;

connecting the common electrode and the first electrode so that the first resonator is short circuited with the crystal in the second position;

applying a plurality of frequencies to the second electrode with the first resonator short circuited with the crystal in the second position;

monitoring a phase response of the crystal with respect to frequency with the first resonator short circuited with the crystal in the second position;

monitoring a time response of the crystal with respect to frequency with the first resonator short circuited with the crystal in the second position;

determining time delay relative maxima for the time response with the first resonator short circuited with the crystal in the second position;

determining a third set of critical frequencies corresponding to the time delay relative maxima with the first resonator short circuited with the crystal in the second position;

disconnecting the common electrode and the first electrode so that the connection is an open circuit with the crystal in the new position;

applying a plurality of frequencies to the second electrode with the first resonator open circuited with the crystal in the second position;

monitoring a phase response of the crystal with respect to frequency with the first resonator open circuited with the crystal in the second position;

monitoring a time response of the crystal with respect to frequency with the first resonator open circuited with the crystal in the second position;

determining time delay relative maxima for the time response with the first resonator open circuited with the crystal in the second position;

determining a fourth set of critical frequencies corresponding to the time delay relative maxima with the first resonator open circuited with the crystal in the second position; and determining the inductance of the first resonator using the third and fourth set of frequencies and the first resonator equivalent static capacitance.

11. A method of measuring resonator inductances of a coupled-dual resonator crystal with a test device, the crystal having a wafer, an input electrode on the wafer, a common electrode on the wafer, an output electrode on the wafer, wherein the connection of the input electrode and the common electrode form a first resonator and the connection of the output electrode and the common electrode form a second resonator, the method comprising:

connecting a signal generator to the input of the first resonator, wherein the signal generator creates a plurality of frequency signals;

applying the plurality of frequencies to the input of the first resonator with the second resonator short circuited;

measuring a first set of critical frequencies produced by the signal generator when a voltage indicating device indicates maximum and minimum voltages;

determining the inductance of the first resonator using the first set of critical frequencies;

reversing the position of the crystal filter in the test device;

reapplying the plurality of frequencies to the input of the second resonator with the first resonator short circuited;

measuring a second set of critical frequencies produced by the signal generator when the voltage indicating device indicates a maximum and minimum voltage;

determining the inductance of the second resonator using the second set of critical frequencies; and whereby the resonator inductances are accurately determined for low and high frequency filters at any step in a crystal manufacturing process.

12. A method of measuring resonator inductances of a coupled-dual resonator crystal with a test device, the crystal having a wafer, an input electrode on the wafer, a common electrode on the wafer, an output electrode on the wafer, wherein the connection of the input electrode and the common electrode form a first resonator and the connection of the output electrode and the common electrode form a second resonator, the method comprising:

connecting a signal generator to the input of the first resonator, wherein the signal generator creates a plurality of frequency signals;

applying the plurality of frequencies to the input of the first resonator with the second resonator open circuited;

measuring a first set of critical frequencies produced by the signal generator when a voltage indicating device indicates maximum voltages;

applying a plurality of frequencies to the input of the first resonator with the second resonator short circuited;

measure the second resonator static capacitance;

measuring a second set of critical frequencies produced by the signal generator when the voltage indicating device indicates maximum voltage; and determining the inductance of the second resonator using the first and second set of frequencies, and the measured second resonator static capacitance.

13. The method of claim 12 further comprising the steps of:

reversing the position of the crystal in the test device;

applying the plurality of frequencies to the input of the second resonator with the first resonator short circuited;

measuring first resonator static capacitance;

measuring a third set of critical frequencies produced by the signal generator when the voltage indicating device indicates maximum voltages;

applying a plurality of frequencies to the input of the second resonator with the first resonator open circuited;

measuring a fourth set of frequencies produced by the signal generator when the voltage indicating device indicates maximum voltages; and determining the inductance of the first resonator using the third and fourth set of frequencies.

14. A method of measuring resonator inductances of a coupled-dual resonator crystal with a test device, the crystal having a wafer, an input electrode on the wafer, a common electrode on the wafer, an output electrode on the wafer, wherein the connection of the input electrode and the common electrode form a first resonator and the connection of the output electrode and the common electrode form a second resonator, the method comprising:

connecting a signal generator to the input of the second resonator, wherein the signal generator creates a plurality of frequency signals;

applying the plurality of frequencies to the input of the second resonator with the first resonator open circuited;

measuring a first set of critical frequencies produced by the signal generator when a voltage indicating device indicates maximum voltages;

applying a plurality of frequencies to the input of the first resonator with the second resonator short circuited;

measure equivalent resonator static capacitance;

measuring a second set of critical frequencies produced by the signal generator when the voltage indicating device indicates a maximum voltage; and determining the inductance of the first resonator using the first and second sets of measured frequencies and the equivalent resonator static capacitance.

15. The method of claim 14 further comprising:

reversing the position of the crystal in the test device;

applying the plurality of frequencies to the input of the first resonator with the second resonator open circuited;

measuring a third set of critical frequencies produced by the signal generator when the voltage indicating device indicates a maximum voltage;

applying the plurality of frequencies to the input of the second resonator with the first resonator short circuited;

measure the equivalent resonator static capacitance;

measuring a fourth set of critical frequencies produced by the signal generator when the voltage indicating device indicates a maximum voltage; and determining the inductance of the second resonator using the third and fourth set of critical frequencies and the equivalent resonator static capacitance.

16. A method of determining resonator inductances of a coupled-dual resonator crystal connected to a test fixture, the crystal having a piezoelectric plate, a first electrode on the plate, a common electrode on the plate, and a second electrode on the plate, wherein the connection of the first electrode and the common electrode form a first resonator and the connection of the second electrode and the common electrode form a second resonator, the method comprising:

inserting the crystal in the test fixture in a first position;

connecting a frequency synthesizer to the first electrode and to a reference point;

applying a plurality of frequencies to the first electrode;

monitoring a phase response of the crystal with respect to frequency;

determining inflection points where the change in phase goes from monotonically decreasing to monotonically increasing;

determining a first set of critical frequencies corresponding to the inflection points;

measuring equivalent static capacitances of the first and second resonator; and calculating the inductance of the first resonator using the first set of critical frequencies, whereby the resonator inductances are accurately determined for low and high frequency filters at any step in a crystal manufacturing process.

17. The method of claim 16 further comprising the steps of:

turning the crystal around in the test fixture so as to place the crystal in a second position;

applying the plurality of frequencies to the second electrode;

monitoring a phase response of the crystal with respect to frequency with the crystal in the second position;

determining inflection points where the change in phase goes from monotonically decreasing to monotonically increasing;

determining a second set of critical frequencies corresponding to the inflection points with the crystal in the second position; and determining the inductance of the second resonator using the second set of frequencies.

18. The method of claim 16, wherein the common electrode is connected to the second electrode by a switch, the switch being in a closed position and the method further comprising the steps of:

determining the inflection points where the change in phase goes from monotonically decreasing to monotonically increasing and also where the change in phase goes from monotonically increasing to monotonically decreasing; and wherein the first set of critical frequencies correspond to the inflection points.

19. The method of claim 16, wherein the second electrode is connected to the common electrode by a external capacitor.

20. The method of claim 16, wherein the second electrode and common electrode are open circuited.

21. A method of determining resonator inductances of a coupled-dual resonator crystal connected to a test fixture, the crystal having a piezoelectric plate, a first electrode on the plate, a common electrode on the plate, and a second electrode on the plate, wherein the connection of the first electrode and the common electrode form a first resonator and the connection of the second electrode and the common electrode form a second resonator, the method comprising:

inserting the crystal in the test fixture in a first position;

connecting a frequency synthesizer to the second electrode and to a reference point;

creating an open circuit between the first electrode and the common electrode;

applying a plurality of frequencies to the second electrode;

monitoring a phase response of the crystal with respect to frequency;

monitoring a time response of the crystal with respect to frequency;

determining time delay relative maxima for the time response;

determining a first set of critical frequencies corresponding to the time delay relative maxima;

measuring equivalent static capacitance of the first resonator;

connecting the common electrode and the second electrode so that the second resonator is short circuited;

applying a plurality of frequencies to the first electrode with the second resonator short circuited;

monitoring a phase response of the crystal with respect to frequency with the second resonator short circuited;

monitoring a time response of the crystal with respect to frequency with the second resonator short circuited;

determining time delay relative maxima for the time response with the second resonator short circuited;

determining a second set of critical frequencies corresponding to the time delay relative maxima with the second resonator short circuited;

calculating the inductance of the first resonator using the first and second sets of critical frequencies and the first resonator equivalent static capacitance;

reversing the position of the crystal in the test fixture so as place the crystal in a second position;

creating an open circuit between the first electrode and the common electrode;

applying a plurality of frequencies to the second electrode;

monitoring a phase response of the crystal with respect to frequency;

monitoring a time response of the crystal with respect to frequency;

determining time delay relative maxima for the time response;

determining a third set of critical frequencies corresponding to the time delay relative maxima;

measuring equivalent static capacitance of the second resonator;

connecting the common electrode and the second electrode so that the second resonator is short circuited;

applying a plurality of frequencies to the first electrode with the second resonator short circuited;

monitoring a phase response of the crystal with respect to frequency with the second resonator short circuited;

monitoring a time response of the crystal with respect to frequency with the second resonator short circuited;

determining time delay relative maxima for the time response with the second resonator short circuited;

determining a fourth set of critical frequencies corresponding to the time delay relative maxima with the second resonator short circuited; and calculating the inductance of the second resonator using the third and fourth sets of critical frequencies and the first resonator equivalent static capacitance.

22. A method of determining resonator inductances of a coupled-dual resonator crystal connected to a test fixture, the crystal having a piezoelectric plate, a first electrode on the plate, a common electrode on the plate, and a second electrode on the plate, wherein the connection of the first electrode and the common electrode form a first resonator and the connection of the second electrode and the common electrode form a second resonator, the method comprising:

inserting the crystal in the test fixture in a first position connecting a frequency synthesizer to the first electrode and to a reference point;

connecting the second electrode and the common electrode so the second resonator is short circuited;

applying a plurality of frequencies to the first electrode with the second resonator short circuited;

monitoring a phase response of the crystal with respect to frequency with the second resonator short circuited;

monitoring a time response of the crystal with respect to frequency with the second resonator short circuited;

determining time delay relative maxima for the time response with the second resonator short circuited;

determining a first set of critical frequencies corresponding to the time delay relative maxima with the second resonator short circuited;

measuring equivalent static capacitances of the first and second resonators;

connecting an external capacitor across the second resonator;

measuring the external capacitance of the external capacitor;

applying a plurality of frequencies to the first electrode;

monitoring a phase response of the crystal with respect to frequency;

monitoring a time response of the crystal with respect to frequency;

determining time delay relative maxima for the time response;

determining a second set of critical frequencies corresponding to the time delay relative maxima; and calculating the inductance of the second resonator using the first and second sets of critical frequencies, the second resonator equivalent static capacitance and the external capacitance.

23. The method of claim 22 further comprising the steps of:

reversing the position of the crystal in the test fixture so as to place the crystal in a second position;

connecting the common electrode and the first electrode so that the first resonator is short circuited with the crystal in the second position;

applying a plurality of frequencies to the second electrode with the first resonator short circuited with the crystal in the second position;

monitoring a phase response of the crystal with respect to frequency with the first resonator short circuited with the crystal in the second position;

monitoring a time response of the crystal with respect to frequency with the first resonator short circuited with the crystal in the second position;

determining time delay relative maxima for the time response with the first resonator short circuited with the crystal in the second position;

determining a third set of critical frequencies corresponding to the time delay relative maxima with the first resonator short circuited with the crystal in the second position;

connecting an external capacitor across the first resonator;

measuring the external capacitance of the external capacitor;

applying a plurality of frequencies to the second electrode with the crystal in the second position;

monitoring a phase response of the crystal with respect to frequency with the crystal in the second position;

monitoring a time response of the crystal with respect to frequency with the crystal in the second position;

determining time delay relative maxima for the time response with the crystal in the second position;

determining a fourth set of critical frequencies corresponding to the time delay relative maxima with the crystal in the second position; and determining the inductance of the first resonator using the third and fourth set of frequencies, the first resonator equivalent capacitance and the external capacitance.

\* \* \* \* \*